United States Patent [19]

Irish et al.

[11] Patent Number: 5,790,838
[45] Date of Patent: Aug. 4, 1998

[54] PIPELINED MEMORY INTERFACE AND METHOD FOR USING THE SAME

[75] Inventors: John David Irish; Charles Luther Johnson, both of Rochester; David John Krolak, Dodge Center; Sheldon Bernard Levenstein, Rochester, all of Minn.

[73] Assignee: International Business Machines Corporation, Armonk, N.Y.

[21] Appl. No.: 700,263

[22] Filed: Aug. 20, 1996

[51] Int. Cl.$^6$ ............................................. G06F 1/04
[52] U.S. Cl. ........................ 395/555; 395/556; 395/559
[58] Field of Search ................................. 395/555, 556, 395/558, 559; 711/100, 169

[56] References Cited

U.S. PATENT DOCUMENTS

| | | | |
|---|---|---|---|
| 4,415,984 | 11/1983 | Gryger et al. | 395/552 |
| 5,093,809 | 3/1992 | Schmitt-Landsiedel et al. | 365/230.03 |
| 5,384,737 | 1/1995 | Childs et al. | 365/189.05 |
| 5,471,607 | 11/1995 | Garde | 395/550 |
| 5,502,835 | 3/1996 | Le et al. | 395/496 |
| 5,703,828 | 12/1997 | Park et al. | 365/230.03 |

OTHER PUBLICATIONS

Pennington, A. and Ueda, M., "Cycle Steal at Rename Register", *IBM Technical Disclosure Bulletin*, vol. 38 No. 09, Sep. 1995, pp. 363–364.

Blake, R., et al. "Cycle Time Independence on the System to Memory Interface when the Delay of the Path is Greater than the Cycle Time", *IBM Technical Disclosure Bulletin*, vol. 36 No. 04, Apr. 1993, pp. 397–398.

*Primary Examiner*—Dennis M. Butler
*Attorney, Agent, or Firm*—Derek P. Martin

[57] ABSTRACT

According to the present invention, a pipelined SRAM structure and clocking method is disclosed. The SRAM interface and clocking method are specifically intended for use with Level 2 and Level 3 cache SRAM memory devices. In the present invention, the oscillator that generates the clock signal for the CPU is also used to generate the clock signals for all of the other components that interface with the SRAM. Each of the generated clock signals are dependant on the same clock event, allowing the clock speed to be decreased for testing or debugging while maintaining higher speed clock edge relationships. The various clock signals that are generated from the oscillator are used to cycle-steal time from multiple cycles. This technique allows sub-5 nanosecond (nS) access to Level 2 and Level 3 cache memory devices that have access times greater than 5 nS.

19 Claims, 3 Drawing Sheets

PIPELINED MEMORY INTERFACE AND METHOD FOR USING THE SAME

BACKGROUND OF THE INVENTION

1. Technical Field

This invention generally relates to the field of semiconductor memory. More specifically, the present invention relates to methods for accessing Static Random Access Memory (SRAM) at clock frequencies in excess of 200 MHz and also at much lower clock frequencies.

2. Background Art

Today, our society is heavily dependant upon computers for everyday activity. Computers are found in our homes, in business offices, and in most production and manufacturing environments. Most computer systems are controlled by a central processing unit (CPU) and have various levels of memory which can be used by the CPU to operate and perform the various functions for which it has been programmed. Typically, computer programs are loaded into the computer system's memory storage areas and executed by the CPU. The programs and data are stored in different areas of the computer system's memory depending on what type of function the CPU is performing. Traditionally, the computer system's memory has been classified as either main memory (primary or main storage) or secondary memory (secondary storage).

Programs and data need to be in main memory in order to be executed or referenced by a running program. Programs or data not needed immediately may be kept in secondary memory until needed and then brought into main storage for execution or reference. Secondary memory media such as tape or disk are generally less costly than the main memory and have much greater capacity. Main memory may generally be accessed much faster than secondary memory.

In systems with several levels of memory storage, a great deal of shuttling goes on in which programs and data are moved back and forth between the various memory levels. This shuttling consumes system resources such as CPU time and bus bandwidth that could otherwise be put to more productive processing use.

In the 1960s it became clear that the traditional memory storage hierarchy could be extended by one more level with dramatic improvements in performance and utilization. This additional level, the "cache", is a high-speed area of memory that is much faster than the main memory. Cache storage is very expensive compared with main memory and therefore, in a typical computer system, only relatively small caches are used.

Today's computer systems have several levels of storage including main memory, secondary memory, and cache memory. On computer systems with cache memory, the current portion of a program and its data are placed in the cache where they can execute or be referenced. These levels of memory create a memory hierarchy; the various levels from cache, to primary, to secondary memory have decreasing cost and speed, and increasing capacity.

Cache memory imposes one more level of shuttling on the computer system. Programs or data in the main memory are shuttled to the very high-speed cache before being executed or referenced. Using the cache, programs may be executed much faster than in main memory. The goal of designers using the cache concept is that the overhead in shuttling programs or data back and forth will be much smaller than the performance increase obtained by the faster execution possible using the cache. In addition, if the specific program instruction to be executed has been pre-loaded into the cache, the CPU may execute the program instruction without returning to either main memory or secondary memory.

In most computer systems, main memory and cache memory are usually implemented by using Random Access Memory (RAM) chips. RAM can be broadly classified into two different categories, Static RAM (SRAM) and Dynamic RAM (DRAM). These two types of RAM have different characteristics which make them useful in different computer memory applications. For example, DRAM is most commonly used in main memory applications. DRAM is relatively inexpensive to manufacture and can be used by the CPU to store data for interim processing. One drawback of DRAM as a memory device is its volatility. Unless the electrical charge which is used to hold the data values in the DRAM chips is maintained at a certain level, the information stored in the DRAM chips will be lost. The periodic cycling of charge to maintain the information in the DRAM chips is called "refreshing" the memory.

SRAM chips, on the other hand, are nonvolatile and the computer can maintain the information stored in SRAM chips without the "refresh" cycle required by DRAM chips. In general, SRAM chips also have faster access times than DRAM chips. This is desirable in applications where speed is most critical. SRAM chips, however, are relatively expensive and can be cost prohibitive if used in large quantities. Cache memory is typically implemented by using SRAM chips.

Cache memory is further subdivided into different categories based on what part of the computer system it is located on or associated with. "On-chip" cache memory is located on the microprocessor chip and is usually referred to as Level 1 cache memory. Cache memory that is not located on the same chip with the microprocessor is usually referred to as Level 2 or Level 3 cache memory.

Along with the proliferation of computers, there has been a constant emphasis on making computer systems perform better. Faster computer systems can increase productivity and make operations more efficient. Most CPUs are driven by an oscillating pulse or signal from an oscillator or clock. Computer system speeds are often measured in terms of the frequency of the clock that drives the CPU. Each oscillation is registered as a clock signal and the CPU will execute program instructions at a speed dependent upon the clock signals it receives from the oscillator. Some simple program instructions can be completed in a single clock cycle while other, more complex program instructions may require multiple clock cycles to complete.

In order to access computer memory, a signal must be sent to the memory device to activate it. It takes a certain amount of time for the signal to reach the memory device. It also takes a certain amount of time after the signal reaches the memory device before the data can be read. In addition, once the memory device outputs the requested data, the data is only valid for a short period of time. These timing constraints create a small window of time during which the memory device can be accessed and valid data can be retrieved. If these timing constraints become excessive, the amount of time required to retrieve data can become limits on the performance of the computer system.

There are several ways a computer system can be made to run faster. The computer system components can be made to operate faster by increasing the overall clock speed of the CPU and/or the related components, by using new techniques which allow the information being processed to be moved through the existing components in a shorter period of time, or a combination of both. Examples of these two different approaches are the advent of faster CPUs and memory chips and techniques such as "cycle stealing" and "pipelining".

The advantage of faster CPUs and memory components is that the information contained in the memory components can be accessed faster and the CPU can process the information more quickly. Every year, engineers are designing CPUs and memory components that operate at faster clock speeds. New CPUs may be clocked, or driven, at much higher speeds than CPUs of even a few years ago. Only a few years ago a typical CPU might operate at a frequency range of 16 MHz –24 MHz whereas today, CPUs that operate at frequencies in excess of 150 MHz are not uncommon. This dramatic increase in component speed has been accompanied by a corresponding increase in the speed of computer systems in general.

Pipelining and cycle stealing, on the other hand, are techniques used in computer systems to increase overall system throughput without changing the actual CPU clock speed. These two techniques are discussed briefly below.

Basically, pipelining allows a computer system to exploit certain types of parallelism when processing program instructions. The processor is arranged very much like a production line in a factory and several program instructions may be in different stages of execution simultaneously. This overlap requires more extensive hardware but it can greatly reduce the total execution time of a sequence of program instructions.

Cycle stealing is the practice of using time from a clock cycle ahead or behind the current clock cycle to initiate or complete a task in a single clock cycle that would otherwise take two or more clock cycles. Pipelining and cycle stealing are often used in tandem to increase overall system efficiency and throughput.

Many computer systems are operated in a synchronous fashion where an oscillator or clock is used to synchronize the various components of the computer system. It is common to generate multiple clock signals from multiple sources in order to drive the different components of a computer system. Often, each component or group of components will be controlled by a different oscillator or clock. Since the object in most commercial applications is to run all of the components at the highest possible clock speeds, manufacturers are continually striving to manufacture components that can operate correctly at higher frequencies. In order to match the speed of the various circuit components so that they can still operate together, the various component's oscillators are "tuned" to match the frequency or speed required by the other system components.

When a computer system requires data from an SRAM memory, it sends a clock signal to the SRAM. Transmitting the clock signal to the SRAM takes a certain amount of time. After the clock signal has reached the SRAM, it takes the SRAM a certain amount of time to prepare the data to be read. In addition, there are additional timing delays from putting the data into latches and for the signal to travel back and forth along the physical wires of the system. If the total amount of the access time exceeds the clock cycle time, then it will take more than one clock cycle to access the SRAM and retrieve the desired data. It is possible, by using some of the techniques described above (such as cycle stealing), to reduce the amount of time required to access data by overlapping the SRAM accesses and using time from an adjacent cycle to perform some tasks. This can be accomplished by careful tuning of the various clocks that make up the system.

However, when a new circuit is being tested and debugged, or when an existing system is being tested, it often becomes necessary to operate the microprocessor and associated memory components at much slower frequencies. If the CPU and the memory components are controlled by separate oscillators or different edge events of the same oscillator, the various oscillators or edges that provide the clock inputs to the various circuit components must be "retuned" in order for the different system components to "synch" up at the lower frequencies. This retuning process is fairly time consuming and can be fraught with uncertainty. It may be extremely difficult to duplicate the exact high frequency operational timing sequences and events at the low frequencies required for laboratory analysis and testing.

What is needed, therefore, is a microprocessor/memory interface that can be operated with SRAM chips at the high frequency levels required for commercial applications but that can also be operated at the very low frequency levels required for laboratory analysis and testing. It is also desirable to eliminate the step of "retuning" the oscillators currently required in order to accurately and easily reproduce high speed operational errors.

DISCLOSURE OF INVENTION

According to the present invention, a pipelined memory interface and clocking method is disclosed to access a memory device. An oscillator or other clock source that generates the clock signal for the CPU is also used to generate the clock signals for all of the other components that interface with the memory device. Each of the generated clock signals are dependant on the same clock event, allowing the clock speed to be decreased for testing or debugging while maintaining higher speed clock edge relationships. The various clock signals that are generated from the oscillator are used to cycle-steal time from multiple cycles. This technique allows sub-5 nanosecond (nS) access to Level 2 and Level 3 cache memory devices.

The problem of high frequency access to a memory device can be solved by sending the memory clock signal early and then sampling the memory data late. In the preferred embodiment, an oscillator is provided to drive the clock input of the memory interface device. From a single oscillator event, multiple clock signals are generated. These disparate signals take different amounts of time to reach their respective locations and allow the data to be accessed in what appears to be one cycle. That is, after the preliminary clock cycles required for the initial pipelining have been completed, new data can be read to or from the memory device on each subsequent clock cycle, even though the actual access time of the memory device may exceed the length of a single clock cycle.

Since the memory device and the processor are controlled by the same oscillator or clock signal, the oscillator can be operated at frequencies of 200 MHZ or higher, but can also be operated at much slower speeds if necessary and the relationship between the various component signals remains constant. Since all of the required timing signals are generated from a single input and memory access is accomplished in a single clock cycle, varying the duration of the clock cycle will not cause the timing problems inherent when multiple oscillators or multiple edge events are used to provide multiple signals.

The foregoing, and other objects, features and advantages of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

According to the present invention, a pipelined SRAM interface and clocking method is disclosed. The SRAM interface and clocking method are specifically intended for use with Level 2 and Level 3 cache SRAM memory devices.

Figure 1:
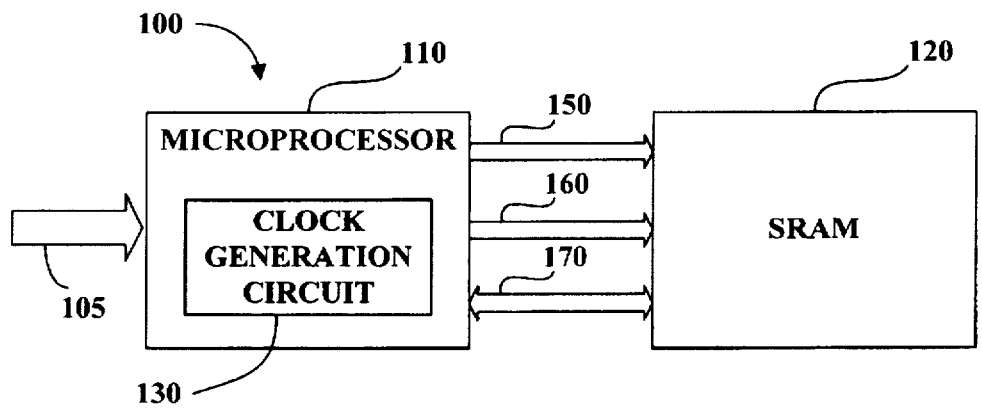
FIG. 1 is a block diagram of a microprocessor and an SRAM device in accordance with the present invention.

Referring to FIG. 1, a circuit 100 according to the present invention comprises: a microprocessor 110, an SRAM 120, a clock generation circuit 130, an SRAM address/control bus 150, an SRAM clock input 160, a bi-directional data bus 170 and a microprocessor oscillator clock input 105. Microprocessor oscillator clock input 105 provides the main signal or master clock signal which operates microprocessor 110 and which is used by clock generation circuit 130 to generate the various signals used in operating the invention, including SRAM clock input 160. SRAM address/control bus 150 allows microprocessor 110 to send control signals and address information that is necessary to store and retrieve data from SRAM 120. Finally, bi-directional data bus 170 is used in the present invention to transfer data between microprocessor 110 and SRAM 120. SRAM 120 is generally considered to be an external component, in that it is not co-located with microprocessor 110 and is at least one clock cycle away in terms of access time.

Figure 2:
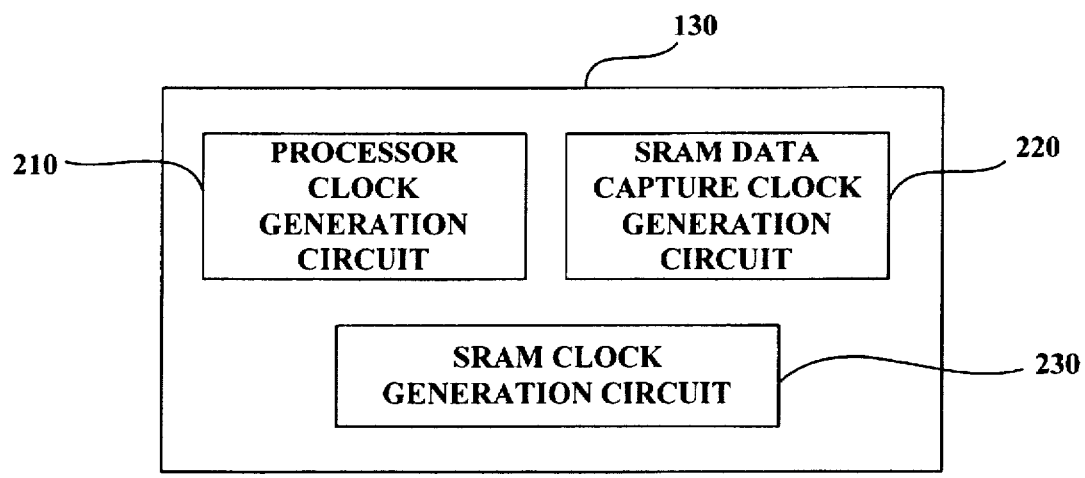
FIG. 2 is a block diagram of the clock generation circuit of FIG. 1.

Referring to FIG. 2, clock generation circuit 130 of FIG. 1 comprises: a processor clock generation circuit 210, an SRAM data capture clock generation circuit 220, and an SRAM clock generation circuit 230. These various clock signals are all derived from the microprocessor oscillator clock input 105 of FIG. 1. In fact, a key feature of the present invention is the use of a single clock event of a single input to generate all of the signals that control accesses to SRAM 120. This allows the timing sequence and the relationship between the signals to remain constant regardless of the frequency of microprocessor oscillator clock input 105. This allows high frequency operation in commercial application but also allows for low frequency operation when desired for debugging, testing, or troubleshooting purposes.

Figure 3:
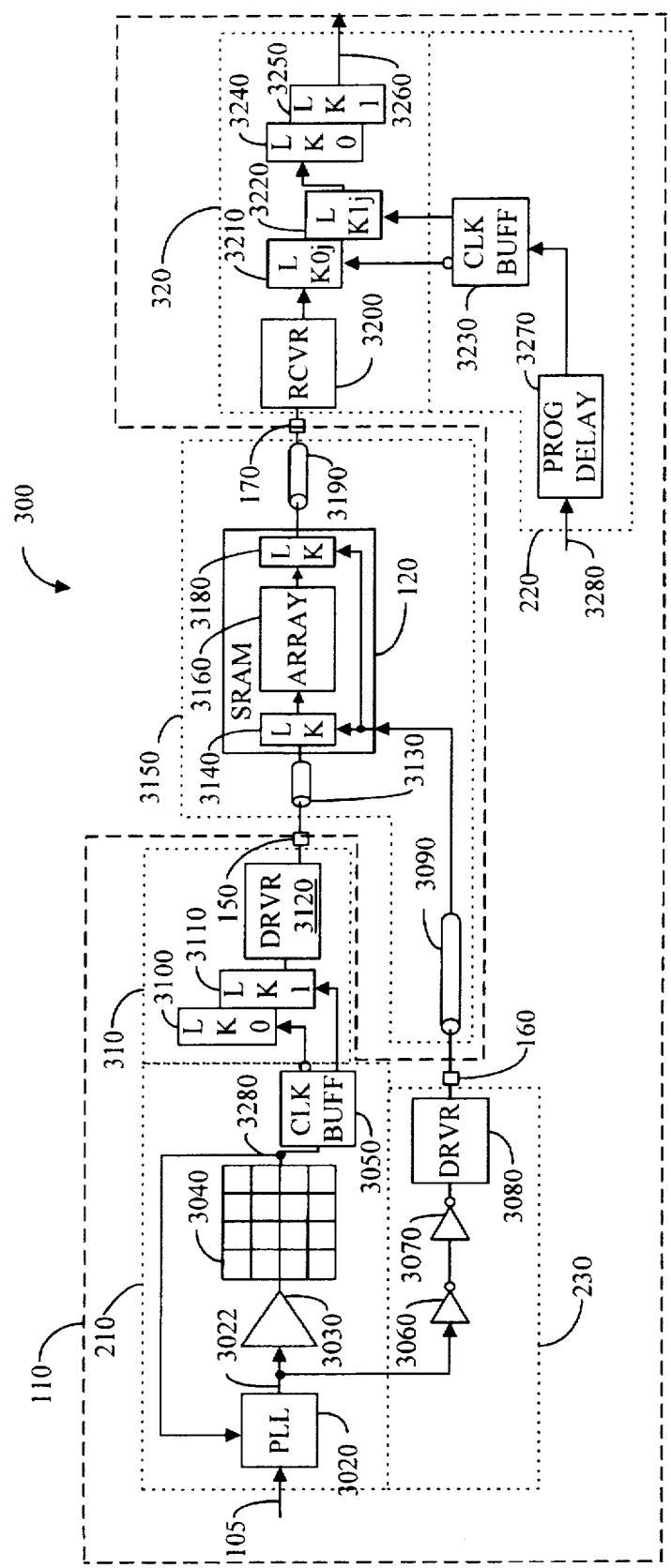
FIG. 3 is a schematic representation of a preferred embodiment of the present invention.

Referring to FIG. 3, a preferred embodiment of the pipelined SRAM interface 300 comprises: SRAM 120, processor clock generation circuit 210, SRAM data capture clock generation circuit 220, SRAM clock generation circuit 230, address latch circuit 310, capture latch circuit 320, and wire connections 3090, 3130, and 3190. Physical wires 3090, 3130, and 3190 have varying lengths according to the interconnect topology between microprocessor 110 and SRAM 120, and any suitable lengths may be used within the scope of the present invention, provided that these wire lengths are sufficient to provide the required data hold time to latch 3140.

Processor clock generation circuit 210 includes: PLL 3020; a clock buffer 3030; a clock grid 3040; and a clock buffer 3050. Clock input 105 is a suitable clock signal for microprocessor 110, and preferably provides a square-wave digital clock with 50% duty cycle. PLL 3020 receives clock input 105, and generates a master clock signal 3022. Master clock signal 3022 may be a multiple or fractional derivative of the clock input signal 105 according to the specific design of PLL 3020. Master clock signal 3022 drives clock buffer 3030, which drives the clock signal to clock grid 3040.

Clock grid 3040 is a grid-like pattern of conductors across the microprocessor 110 that distributes the clock grid signal 3280 of clock buffer 3030 to all circuits within microprocessor 110 that are coupled to clock grid 3040. Clock grid signal 3280 is, given the physical constraints of the system, distributed in a simultaneous manner. One of the circuits that is coupled to clock grid signal 3280 is clock buffer 3050. Clock buffer 3050 provides a differential clock output, driving one output high when the other is low and vice-versa. Clock buffer 3050 drives address latches 3100 and 3110 on opposite phases of the clock, creating two latches 3100 and 3110 that function like a single D flip-flop. The outputs of clock buffer 3050 collectively comprise an address clock signal.

Address latch circuit 310 comprises: address registers 3100 and 3110; and a driver 3120. Address registers 3100 and 3110 latch an address from microprocessor 110 to SRAM 120 in response to the outputs of clock buffer 3050. The address is provided to driver 3120, which drives the address onto a portion of address/control bus 150.

SRAM clock generation circuit 230 includes: inverters 3060 and 3070 and an off-chip driver 3080. Inverters 3060 and 3070 serve as a re-powering circuit that buffers master clock signal 3022 from driver 3080. The output of inverter 3060 is used as the input to inverter 3070. Inverters 3060 and 3070 serve two purposes; first, they act as a small repower tree for the signal; and second, they impart a small time delay to the signal that passes through inverters 3060 and 3070 as compared to the delay from master clock signal 3022 to the output of clock grid signal 3280. The clock signal from driver 3080 is an SRAM clock signal, and is driven to SRAM 120 via SRAM clock input 160.

SRAM data capture clock generation circuit 220 includes: clock grid signal 3280 driving a programmable delay circuit 3270; and clock buffer 3230. Clock grid signal 3280 comes from clock grid 3040 and is the same signal as the signal which drives clock buffer 3050. Clock grid signal 3280 is input into programmable delay circuit 3270. While programmable delay circuit 3270 is not described in detail, it may be comprised of buffers, inverters or any other type of components which impart a delay appropriate to the purposes of the invention. In turn, programmable delay circuit 3270 is used to drive clock buffer 3230. Clock buffer 3230 provides a differential clock output, driving one output high when the other is low and vice-versa.

SRAM data capture clock generation circuit 220 includes the specific configuration disclosed in FIG. 3, and includes other circuit configurations as well. For example, new SRAM proposals from the Joint Electronic Device Engineering Council (JEDEC) include an "echo clock" provided by the SRAM to identify the data window for the SRAM. SRAM data capture clock generation circuit 220 may be driven by the "echo clock" signal, or by any other suitable signal that produces the pipelined access to SRAM 120 in accordance with the present invention.

Data capture circuit 320 includes: an off-chip receiver 3200; capture latches 3210 and 3220; a clock buffer 3230; data registers 3240 and 3250; data register output signal 3260. SRAM 120 drives its data output to receiver 3200, which in turn drives capture latch 3210. Clock buffer 3230 drives capture latches 3210 and 3220 on opposite phases of the clock, creating two latches 3210 and 3220 that function like a single D flip-flop. The outputs of clock buffer 3230 collectively comprise a data capture clock signal. Capture registers 3210 and 3220 thus capture the data from SRAM 120.

One suitable configuration for SRAM 120 includes: memory array 3160; and internal latches 3140 and 3180. Memory array 3160 is a suitable SRAM array arranged in an array of rows and columns of memory cells. Any location within memory array 3160 may be accessed by providing the address of the location to be addressed. Latch 3140 receives the address and latch 3180 receives the SRAM memory array outputs. Note that SRAM 120 may have many different configurations. The specific configuration shown in FIG. 3 is a simplification that illustrates that SRAM 120 is capable of accepting an address during one clock cycle and producing the data for that address on the following clock cycle.

The propagation delay of the SRAM clock signal to SRAM 120 though the path that includes inverters 3060 and 3070 is not as great as the propagation delay of the address clock signal through the path that includes clock grid 3040. This means that although the signals presented to SRAM 120 have a common origin in time, the signals arrive at SRAM 120 at different times. This allows SRAM 120 to be accessed in clock cycle times which are less than the normal access time of SRAM 120.

Figure 4:
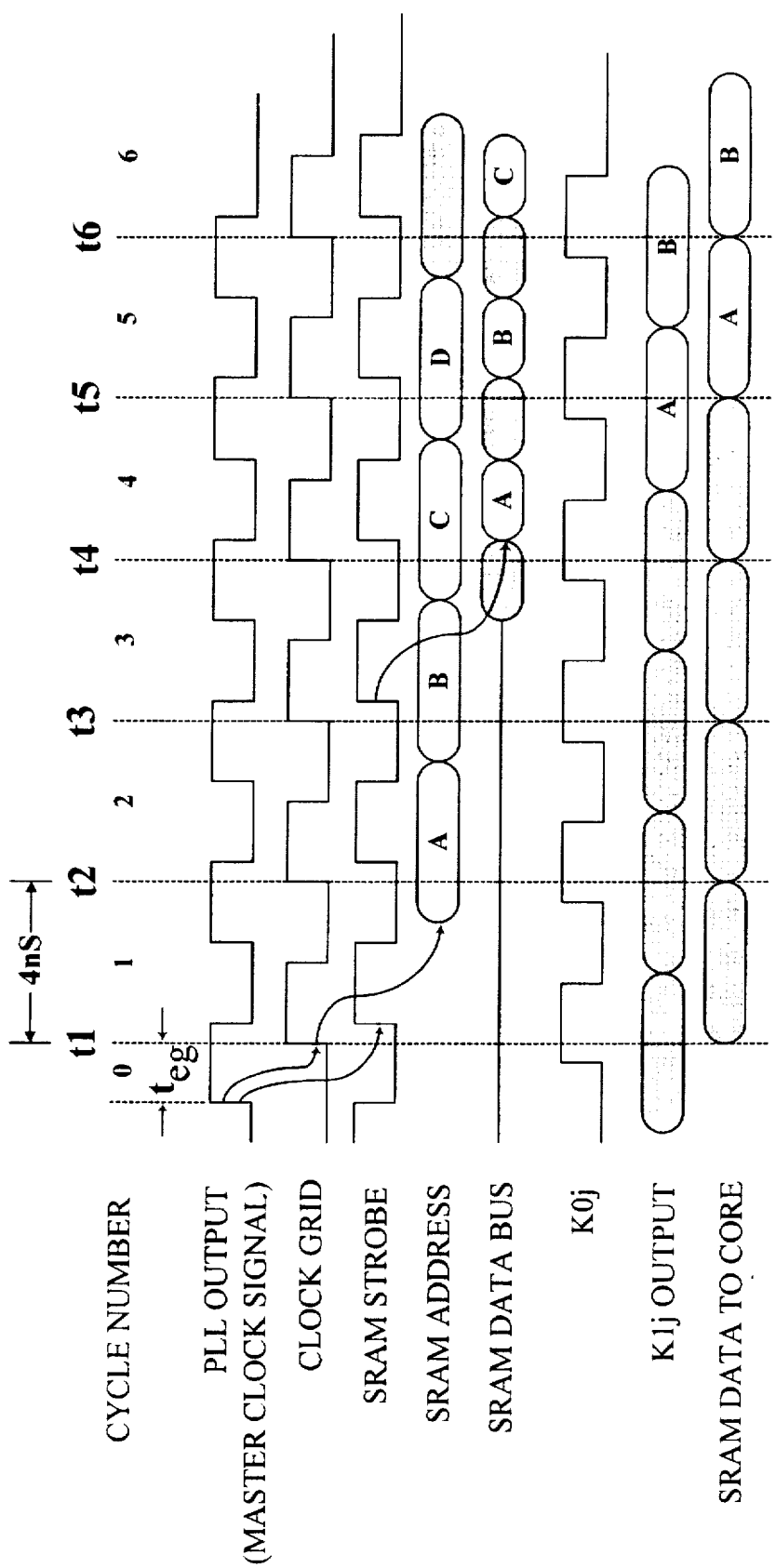
FIG. 4 is a timing diagram of the various signals generated by the components of FIG. 3.

Referring to FIG. 4, a timing diagram illustrates the relationship between the critical signals generated by the pipelined SRAM interface 300 of FIG. 3. A typical complete clock cycle, cycle 1, is illustrated by the rising of the clock signal at clock grid 3040 from a low level to a high level at time t1 and the falling of the clock signal from the high level back to the low level at a point midway through the cycle and continues until the rising of the clock signal at time t2. Subsequent clock cycles are of the same duration and each clock cycle is labeled accordingly. Cycle 2 begins at time t2 and ends at time t3. Cycle 3 begins at time t3 and ends at time t4. A similar pattern exists for each of the subsequent cycles, cycle 4, cycle 5, and cycle 6. Each complete cycle represents a 4nS time period, resulting in a master clock signal of 250 MHz.

During cycle 0, the clock signal from PLL 3020 causes master clock signal 3022 to rise. Master clock signal 3022 also propagates through clock buffer 3030, causing clock grid signal 3280 from clock grid 3040 to rise, thereby commencing cycle 1. The delay between the rising edge of the master clock signal 3022 and clock grid signal 3280 is the delay through clock buffer 3030, represented as $t_{cg}$ in FIG. 4. In addition, the rising edge of master clock signal 3022 propagates through the small re-power tree represented by inverters 3060 and 3070, through driver 3080, and through wire 3090, arriving at SRAM 120 as the rising edge of SRAM clock signal in cycle 1 as shown in FIG. 4. During cycle 1, the rising edge of clock grid signal 3280 from clock grid 3040 causes an SRAM address A to be presented to SRAM 120.

During cycle 2, address B and another SRAM clock signal are sent to SRAM 120. SRAM 120 responds to the rising edge of SRAM clock signal by latching address A into address latch 3140 of SRAM 120. This starts the memory array access for address A in memory array 3160. The rising edge of SRAM clock signal also latches data on data latch 3180, but the data latched does not yet correspond to a valid access to SRAM 120.

During cycle 3, address C and another SRAM clock signal are sent to SRAM 120. SRAM 120 responds to the rising edge of SRAM clock signal by latching address B into address latch 3140 of SRAM 120. This starts the memory array access for address B in memory array 3160. This also completes memory array access for address A and the memory array data for address A is latched into output register 3180.

During cycle 4, address D and another SRAM clock signal are sent to SRAM 120. SRAM 120 responds to the rising edge of SRAM clock signal by latching address C into address latch 3140 of SRAM 120. This starts the memory array access for address C in memory array 3160. This also completes memory array access for address B and the memory array data for address B is latched into output register 3180. In addition, the rising edge of clock grid signal 3280 from clock grid 3040 is delayed through programmable delay circuit 3270 and clock buffer 3230 and latches the data from address A, which is contained in output register 3180 of SRAM 120, into capture registers 3210 and 3220.

During cycle 5, another address and another SRAM clock signal are sent to SRAM 120. SRAM 120, responds to the rising edge of SRAM clock signal by latching address D into address latch 3140 of SRAM 120. This starts memory array access for address D in memory array 3160. This also completes memory array access for address C and the memory array data for address C is latched into output register 3180. In addition, the rising edge of clock grid signal 3280 from clock grid 3040 is delayed through programmable delay circuit 3270 and clock buffer 3230 and latches the data from address B, which is contained in output register 3180 of SRAM 120, into capture registers 3210 and 3220. Data from latch 3220 is latched into data registers 3240 and 3250, resynchronizing it with the processor, and the data is then sent to the CPU (not shown) for use via data register output signal 3260.

Thus in cycle 4, on a single clock edge event, i.e. the rising edge of PLL 3020 output, four unique events happen. Address D is launched from the processor to SRAM 120, memory array access for address C in SRAM 120 is launched, memory array data for address B is sent from SRAM 120 to output latch 3180 and launched to off-chip receiver 3200, and the memory array data from address A is captured in capture registers 3210 and 3220.

The data is read from output latch 3180 of memory array 3160 in the same cycle where the address presented for access to SRAM 120 is being changed. The wire delay associated with wire 3190 satisfies the hold time for the data sent from output latch 3180 that is captured in capture registers 3210 and 3220.

The amount of time required to access SRAM 120 and get data out of it is approximately 6.7 nS. Accordingly, if only one activity took place during a clock cycle, the theoretical limits of throughput would be at least 6.7 nS. The unique combination of pipelining and cycle stealing of the present invention allows clocking to be started early and the data to be sampled late, acheiving data throughput from SRAM 120 in a single 4 nS clock cycle. As another benefit, since all of the significant events were triggered by a single change in the clock, all of the subsequent access timing is controlled by a single clock event. This means that the frequency or cycle time of the input clock can be altered without adversely changing the relative timing of the circuit. The components will continue to relate to each other in the same fashion.

While the invention has been particularly shown and described with reference to preferred embodiments thereof, it will be understood by those skilled in the art that various changes in form and details may be made therein without departing from the spirit and scope of the invention. For example, the pipelined SRAM interface may be used in any off-chip L2 or L3 cache environment. In addition, any suitable design may be implemented for processor clock generation circuit 210, for SRAM data capture clock generation circuit 220, and for SRAM clock generation circuit 230. Any particular design of these clock generation circuits 210, 220, and 230 is within the scope of the present invention, regardless of the components used or specific frequency of operation.

We claim:

1. A memory interface for a memory device, the memory interface comprising:

a data capture clock generation circuit, the data capture clock generation circuit generating at least one data capture clock signal coupled to the memory device;

a processor clock generation circuit, the processor clock generation circuit generating an address clock signal coupled to the memory device;

a memory clock generation circuit, the memory clock generation circuit generating at least one memory clock signal, the at least one memory clock signal latching in the address to the memory device and latching data out from the memory device; and a master clock signal, the master clock signal providing a clock event which is used to generate the data capture clock signal, the address clock signal, and the memory clock signal.

2. The memory interface of claim 1 wherein the memory device is a level 2 SRAM cache.

3. The memory interface of claim 1 wherein the memory device is a level 3 SRAM cache.

4. A computer-implemented method of accessing an external component, the method comprising the steps of:

providing an external component;

providing a capture register;

generating a master clock signal;

generating from the same event of the master clock signal:
   an external component clock signal;
   an address clock signal; and
   a data capture clock signal;

accessing the external component by supplying the external component clock signal and the address clock to the external component, and supplying the capture clock signal to the capture register.

5. The method of claim 4, further comprising the steps of:

providing a main oscillator signal;

using the main oscillator signal to generate the master clock signal.

6. The method of claim 4 wherein the external memory component is an SRAM memory device.

7. The method of claim 6 wherein the SRAM memory device further comprises a level 2 cache.

8. The method of claim 6 wherein the SRAM memory device further comprises a level 3 cache.

9. The method of claim 4 wherein the method uses cycle-stealing to access the external component.

10. A method of accessing an external memory device, the method comprising the steps of:

providing a microprocessor, the microprocessor having a plurality of internal latches;

providing a data capture register;

providing the external memory device;

inputting a first clock signal into the microprocessor;

generating a second clock signal, a third clock signal, and a fourth clock signal from a single first clock signal event;

supplying the second clock signal to the internal latches of the microprocessor to latch addresses into the external memory device;

supplying the third clock signal to the external memory device to latch data from the external memory device;

supplying the fourth clock signal to the data capture register, so that the data capture register captures the data from the external memory device wherein the leading edge of the third clock signal arrives at the external memory device relative to the leading edge of the second clock signal arriving at the internal latches of the microprocessor and the leading edge of the fourth clock signal corresponds to a valid capture window for the external memory device.

11. The method of claim 10 wherein the external memory device is a level 2 SRAM cache.

12. The method of claim 10 wherein the external memory device is a level 3 SRAM cache.

13. The method of claim 10 wherein the fourth clock signal is programmable.

14. The method of claim 10 wherein the method uses cycle-stealing to access the external memory device.

15. An interface apparatus for at least one external component, the interface apparatus comprising:

a clock input for generating a first clock signal and a second clock signal from a single event of the clock input;

at least one latch clocked by the first clock signal to capture data from the external component;

the second clock signal being supplied to the external component such that the external component operates at any frequency up to the maximum operating frequency of the external component.

16. The interface apparatus of claim 15 wherein the external component is an SRAM memory device.

17. The interface apparatus of claim 15 wherein the external component is a level 2 SRAM cache.

18. The interface apparatus of claim 15 wherein the external component is a level 3 SRAM cache.

19. The interface apparatus of claim 15 wherein the interface apparatus employs cycle-stealing to access the external component.

* * * * *